United States Patent
Park et al.

(10) Patent No.: US 6,927,810 B2
(45) Date of Patent: Aug. 9, 2005

(54) LIQUID CRYSTAL DISPLAY DEVICE HAVING INDENTED GATE ELECTRODE AND FABRICATING METHOD THEREOF

(75) Inventors: Kwang-Soon Park, Daegu (KR); Chul-Woo Im, Gyeongsangbuk-do (KR); Sang-Moo Song, Daegu (KR); Cheol-Min Woo, Gyeongsangbuk-do (KR); Seung-Kyu Choi, Daegu (KR)

(73) Assignee: LG. Philips LCD Co., Ltd., Seoul (KR)

( * ) Notice: Subject to any disclaimer, the term of this patent is extended or adjusted under 35 U.S.C. 154(b) by 63 days.

(21) Appl. No.: 10/442,165

(22) Filed: May 21, 2003

(65) Prior Publication Data

US 2003/0218699 A1 Nov. 27, 2003

(30) Foreign Application Priority Data

May 23, 2002 (KR) .............................. 10-2002-0028605

(51) Int. Cl.[7] ............................................. G02F 1/136
(52) U.S. Cl. .............................. 349/46; 257/59; 257/72
(58) Field of Search ....................... 349/48, 46; 257/59, 257/72

(56) References Cited

U.S. PATENT DOCUMENTS

| | | | | |
|---|---|---|---|---|
| 5,084,905 A | * | 1/1992 | Sasaki et al. ............... | 257/776 |
| 5,287,206 A | * | 2/1994 | Kanemori et al. .......... | 349/143 |
| 5,926,235 A | * | 7/1999 | Han et al. ................... | 349/43 |
| 5,945,256 A | | 8/1999 | Endo et al. | |
| 6,016,174 A | | 1/2000 | Kim et al. | |
| 6,078,364 A | * | 6/2000 | Atherton ..................... | 349/38 |
| 6,184,963 B1 | * | 2/2001 | Someya et al. ............. | 349/147 |
| 6,504,593 B1 | * | 1/2003 | Noritake et al. ............ | 349/139 |
| 6,548,831 B1 | * | 4/2003 | Tokuhiro et al. ............ | 257/72 |
| 6,639,281 B2 | * | 10/2003 | Kane et al. ................. | 257/350 |
| 6,721,028 B2 | * | 4/2004 | Kim et al. ................... | 349/141 |
| 6,762,805 B2 | * | 7/2004 | Ishino ........................ | 349/46 |

FOREIGN PATENT DOCUMENTS

| | | | | |
|---|---|---|---|---|
| EP | 647971 A1 | * | 4/1995 | ......... H01L/29/772 |
| JP | 4-88641 | | 3/1992 | |
| KR | 1999-0016190 | | 3/1999 | |
| KR | 1999-0085789 | | 12/1999 | |

* cited by examiner

Primary Examiner—Kenneth Parker
(74) Attorney, Agent, or Firm—Heller Ehrman LLP

(57) ABSTRACT

An array substrate for a liquid crystal display device, comprising: a substrate; a gate line on the substrate; a data line crossing the gate line to define a pixel region; a thin film transistor connected to the gate line and the data line, and includes a gate electrode, an active layer, an ohmic contact layer, and source and drain electrodes; and a pixel electrode connected to the thin film transistor, and disposed at the pixel region, wherein the gate electrode includes a first sunken portion overlapping the drain electrode and a second portion overlapping the same electrode.

13 Claims, 5 Drawing Sheets

US 6,927,810 B2

LIQUID CRYSTAL DISPLAY DEVICE HAVING INDENTED GATE ELECTRODE AND FABRICATING METHOD THEREOF

The present invention claims the benefit of Korean Patent Application No. 2002-28605 filed in Korea on May 23, 2002, which is hereby incorporated by reference.

BACKGROUND OF THE INVENTION

1. Field of the Invention

The present invention relates to a liquid crystal display device, and more particularly, to a switching element having a sunken gate electrode of an array substrate for a liquid crystal device and a fabricating method thereof.

2. Discussion of the Related Art

Generally, a liquid crystal display (LCD) device uses optical anisotropy and polarization properties of liquid crystal molecules. The liquid crystal molecules have a definite orientational order in alignment resulting from their thin and long shapes. The alignment direction of the liquid crystal molecules can be controlled by applying an electric field to the liquid crystal molecules. In other words, as the intensity of the electric field is changed, the alignment of the liquid crystal molecules also changes. Since incident light through liquid crystal is refracted based on an orientation of the liquid crystal molecules, due to the optical anisotropy of the aligned liquid crystal molecules, intensity of the incident light can be controlled and images can be displayed.

Among the various types of LCD devices commonly used, active matrix LCD (AM-LCD) devices having thin film transistors (TFTs) and pixel electrodes connected to the TFTs disposed in matrix form, have been developed because of their high resolution and superiority in displaying moving images.

FIG. 1 is a schematic perspective view of a liquid crystal display device according to the related art. In FIG. 1, a liquid crystal display (LCD) device 11 includes a first substrate 5 having a transparent common electrode 18 on a color filter layer 7 including sub color filters 7a to 7c and a black matrix 6 between the adjacent sub color filters 7a to 7c, and a second substrate 22 having a pixel electrode 17, a switching element "T" and array lines. Further, a liquid crystal layer 14 is interposed between the first and second substrates 5 and 22. The first and second substrates 15 and 22 are commonly referred to as a color filter substrate and an array substrate, respectively. The switching element "T," for example, is a thin film transistor (TFT) disposed in a matrix arrangement and connected to a gate line 13 and a data line 15 crossing each other. A pixel region "P" is defined at a crossing portion of the gate line 13 and the data 15, and the pixel electrode 17 is made of a transparent conductive material disposed at the pixel region "P."

The LCD device is driven by an electro-optical effect of the liquid crystal layer 14. Since the liquid crystal layer 14 is made of a material having dielectric anisotropy and spontaneous polarization, a dipole is formed in the liquid crystal layer 14 due to the spontaneous polarization when a voltage is applied. Thus, an alignment direction of liquid crystal molecules is changed according to a direction of an electric field resulting from the applied voltage. An optical property depends on the alignment state, and this phenomenon is a kind of an electrical light modulation. Therefore, the LCD device displays images by shielding or transmitting light using the electrical light modulation.

FIG. 2 is a schematic plane view showing an array substrate for a liquid crystal display device according to the related art. In FIG. 2, a gate line 13 and a data line 15 cross each other, and a thin film transistor (TFT) "T" is disposed at a crossing of the gate line 13 and the data line 15. A scan signal and an image signal are supplied to the gate line 13 and the data line 15 from an external circuit (not shown), respectively. The switching element TFT "T" is connected to the gate line 13, the data line 15, and a pixel electrode 17.

The TFT "T" includes a gate electrode 31, an active layer 32, and source and drain electrodes 33 and 35. The gate electrode 31 is connected to the gate line 13. The source and drain electrodes 33 and 35 are formed to overlap the gate electrode 31 are spaced apart from each other with the active layer 32 as a center. The active layer 32 is formed of one of amorphous silicon (a–Si:H) and polycrystalline silicon (p-Si). The source electrode 33 is connected to the data line 15 and the drain electrode 35 is connected to the pixel electrode 17 of the pixel region "P." The pixel electrode 17 extends over the gate line 13, and a storage capacitor "$C_{ST}$" is formed between the overlapped gate and pixel electrodes 13 and 17. In another embodiment, the storage capacitor can be formed in the other structure.

When a scan signal is supplied to the gate electrode 31 through the gate line 13, the TFT "T" is turned ON. At the same time, an image signal synchronized with the scan signal is supplied to the pixel electrode 17 through the drain electrode 35. Thus, the liquid crystal layer 14 (of FIG. 1) on the pixel electrode 17 is re-arranged by a spontaneous polarization according to the applied image signal. When the scan signal is not supplied to the gate electrode 31, the TFT "T" is turned OFF. In the OFF state, charges of the pixel electrode accumulated during the ON state are undesirably discharged through the TFT "T" and the liquid crystal layer 14 (of FIG. 1). To prevent this undesirable discharge (leakage), the storage capacitor "$C_{ST}$" is used. The storage capacitor "$C_{ST}$" connected in parallel to the pixel electrode 17 (of FIG. 1) compensates the discharged charges to retain a data voltage of the image signal.

The image signal supplied to the pixel electrode 17 through the drain electrode 35 varies with effects of parasitic capacitances between terminals of the TFT "T." A gate-source parasitic capacitance "$C_{GS}$" is generated at an overlapping portion of the gate electrode 31 and the source electrode 33. A gate-drain parasitic capacitance "$C_{GD}$" is generated at an overlapping portion of the gate electrode 31 and the drain electrode 35. When the active layer 32 is saturated, charges are concentrated on the drain electrode 35 and the gate-drain parasitic capacitance "$C_{GD}$" increases.

FIG. 3 is a schematic plane view showing a thin film transistor of an array substrate for a liquid crystal display device according to the related art. In FIG. 3, a thin film transistor (TFT) "T" includes a gate electrode 31, an active layer 32, and source and drain electrodes 33 and 35. The active layer 32 overlaps the gate electrode 31 and the source and drain electrodes 33 and 35. When a scan signal is applied to the gate electrode 31, the TFT "T" is turned ON and an image signal is applied to a liquid crystal capacitor and a storage capacitor "$C_{ST}$" (of FIG. 2) through the drain electrode 35. The supplied image signal, which is a pixel voltage "$V_p$," is retained even after the TFT is turned OFF. However, the pixel voltage "$V_p$" varies with a gate-drain parasitic capacitance "$C_{GD}$" generated at an overlapping portion "D" of the gate electrode 31 and the drain electrode 33. A voltage shift "$\Delta V_p$," defined by a difference of the pixel voltage "$V_p$" is commonly referred to as a level shift voltage or a kickback voltage. The kickback voltage "$\Delta V_p$" is a DC (direct current) voltage offset of the pixel voltage "$V_p$" AC (alternative current) driven due to the gate-drain parasitic capacitance "$C_{GD}$." The kickback voltage "$\Delta V_p$" can be expressed as follows.

$$\Delta V_p = C_{GD} \cdot (V_{GH} - V_{GL})/(C_{LC} + C_{ST} + C_{GD}) \quad (1),$$

where $C_{LC}$ is a liquid crystal capacitance, $C_{ST}$ is a storage capacitance, $C_{GD}$ is a gate-drain parasitic capacitance of an overlapping portion of a gate electrode and a drain electrode, $V_{GH}$ is a gate high voltage when a TFT is turned ON, and $V_{GL}$ is a gate low voltage when a TFT is turned OFF.

The kickback voltage "$\Delta V_p$" causes several disadvantages, such as a flicker, image sticking, and non-uniformity of brightness, thereby the display quality of an LCD device is deteriorated.

SUMMARY OF THE INVENTION

Accordingly, the present invention is directed to a liquid crystal display device that substantially obviates one or more of the problems due to limitations and disadvantages of the related art.

An object of the present invention is to provide a liquid crystal display device having high display quality by minimizing parasitic capacitance between a gate electrode and a drain electrode.

Another object of the present invention is to provide a liquid crystal display device having a gate electrode of a sunken shape.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes: a substrate; a gate line on the substrate; a data line crossing the gate line, the data line defining a pixel region with the gate line; a thin film transistor connected to the gate line and the data line, the thin film transistor including a gate electrode, an active layer, an ohmic contact layer, and source and drain electrodes, the gate electrode overlapping the drain electrode to define a first overlapping portion and overlapping the source electrode to define a second overlapping portion, the gate electrode having a first sunken portion in the first overlapping portion; and a pixel electrode connected to the thin film transistor, the pixel electrode being disposed at the pixel region.

In another aspect, a fabricating method of an array substrate for a liquid crystal display device includes: forming a gate line and a gate electrode on a substrate, the gate electrode having first and second sides facing each other, the gate electrode having a first sunken portion at the first side; forming a gate insulating layer on the gate line and the gate electrode; forming an active layer on the gate insulating layer; forming an ohmic contact layer on the active layer; forming a data line and source and drain electrodes on the ohmic contact layer, the data line crossing the gate line and defining a pixel region with the gate line, the drain electrode overlapping the gate electrode at the first side, the source electrode overlapping the gate electrode at the second side; forming a passivation layer on the data line and the source and drain electrodes, the passivation layer having a drain contact hole exposing the drain electrode; and forming a pixel electrode at the pixel region, the pixel electrode being connected to the drain electrode through the drain contact hole.

In another aspect, a thin film transistor includes: a substrate; a gate electrode on the substrate, the gate electrode having first and second sides facing each other, the gate electrode having a first sunken portion at the first side; an active layer over the gate electrode; and source and drain electrodes over the active layer, the drain electrode overlapping the gate electrode at the first side, the source electrode overlapping the gate electrode at the second side.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
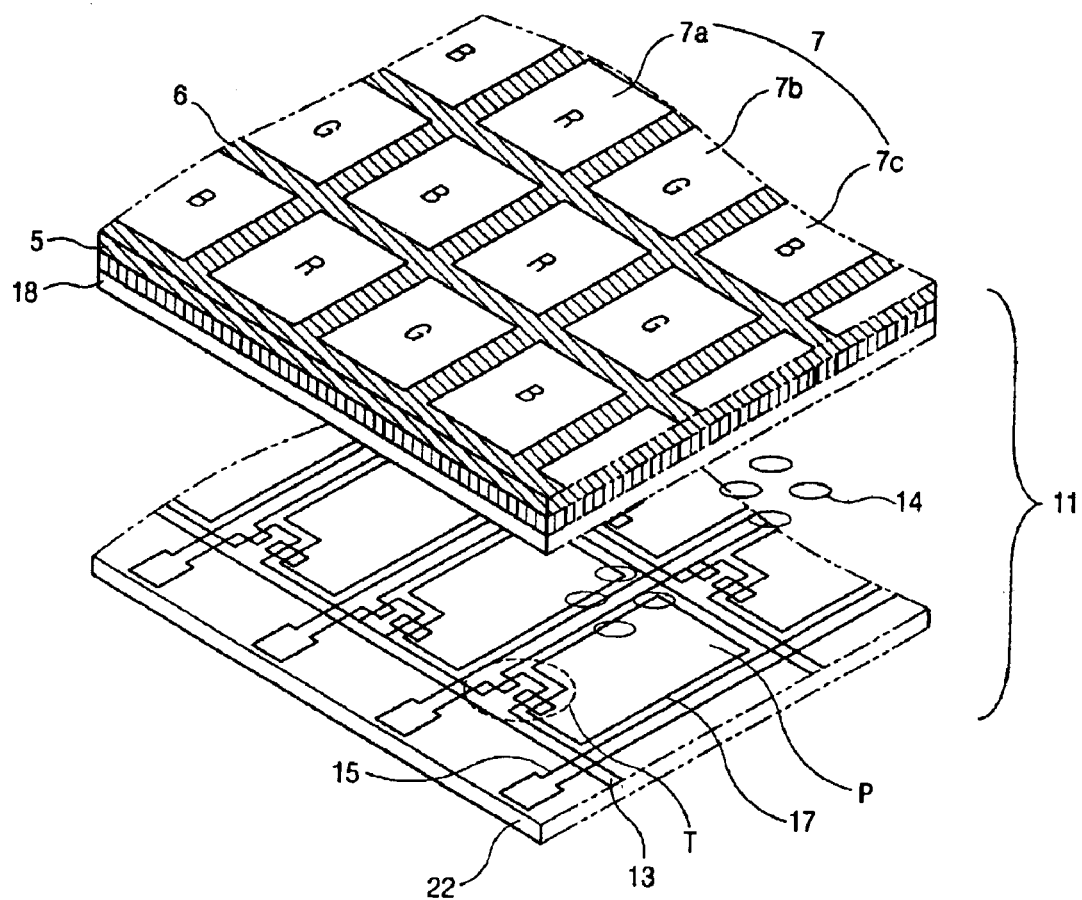
FIG. 1 is a schematic perspective view of a liquid crystal display device according to the related art.
Figure 2:
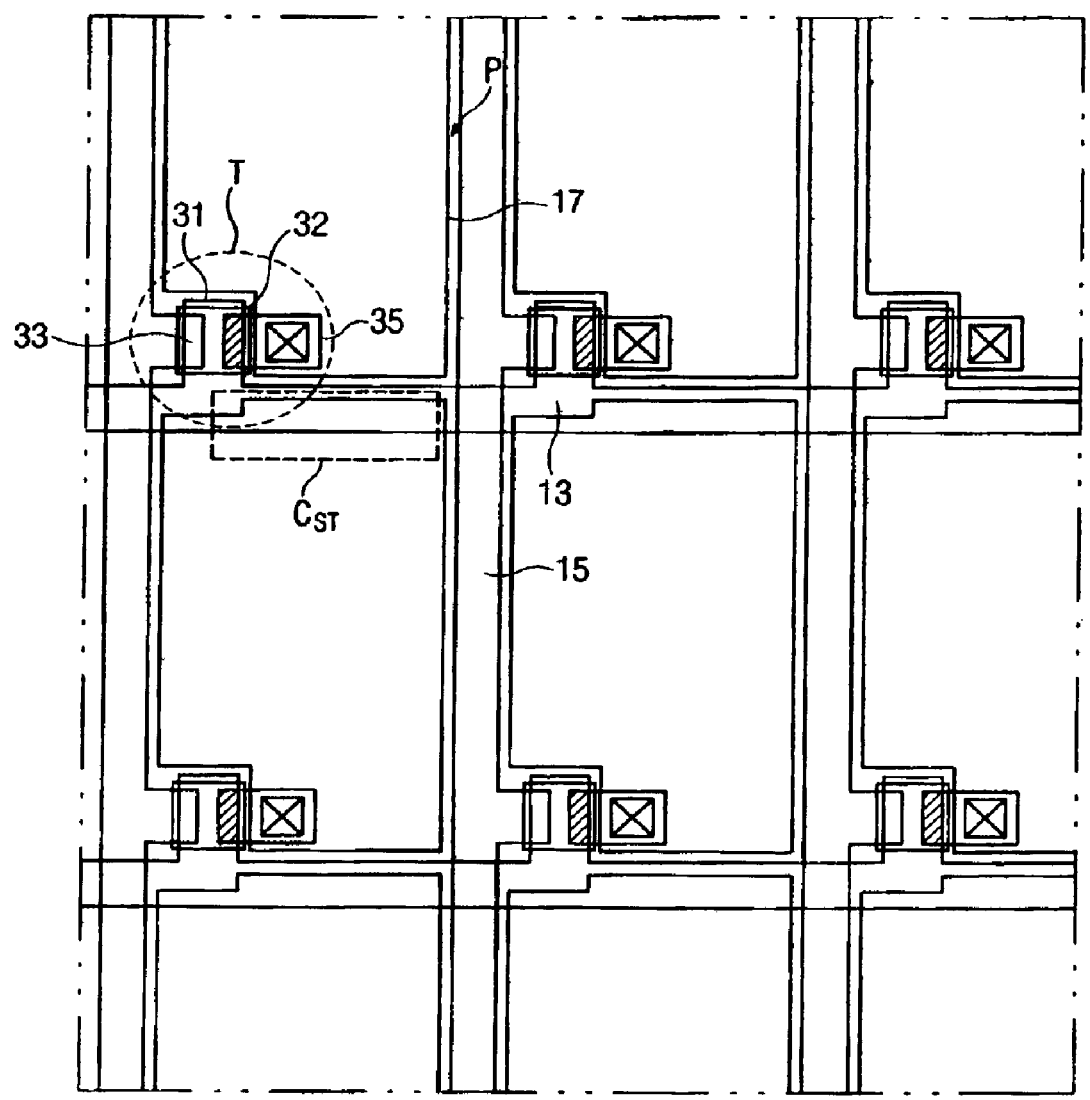
FIG. 2 is a schematic plane view showing an array substrate for a liquid crystal display device according to the related art.
Figure 3:
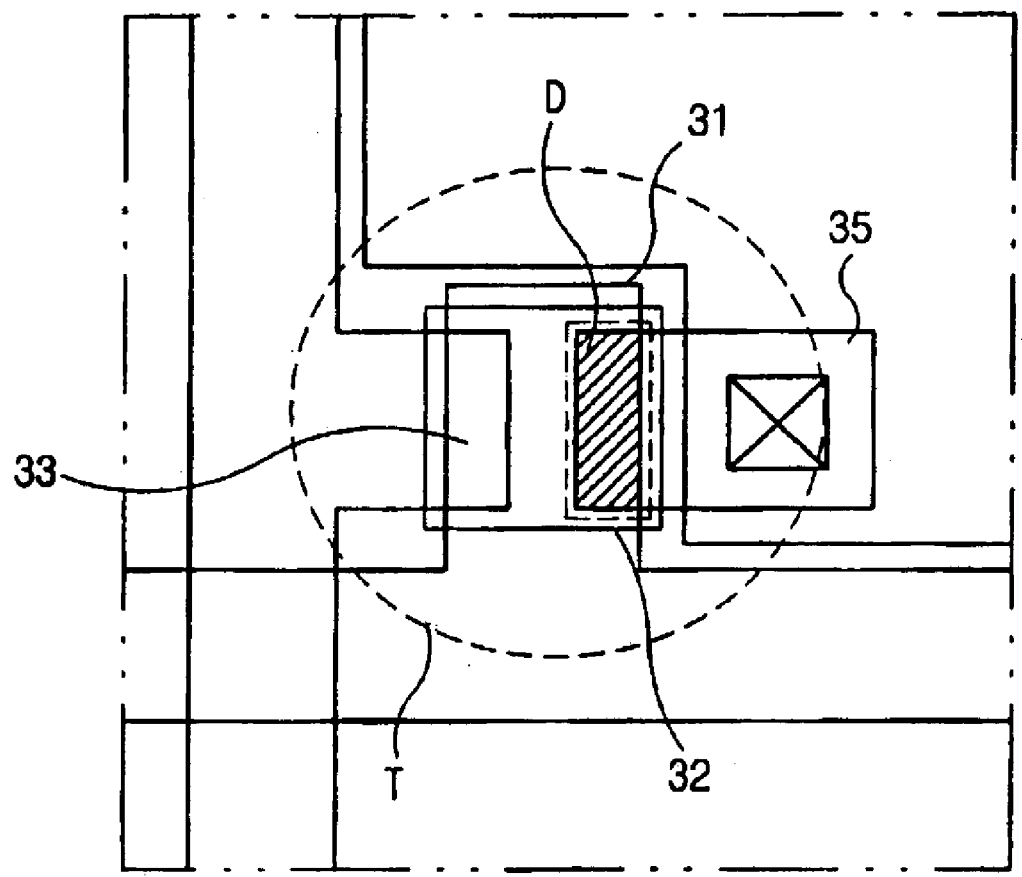
FIG. 3 is a schematic plane view showing a thin film transistor of an array substrate for a liquid crystal display device according to the related art.
Figure 4:
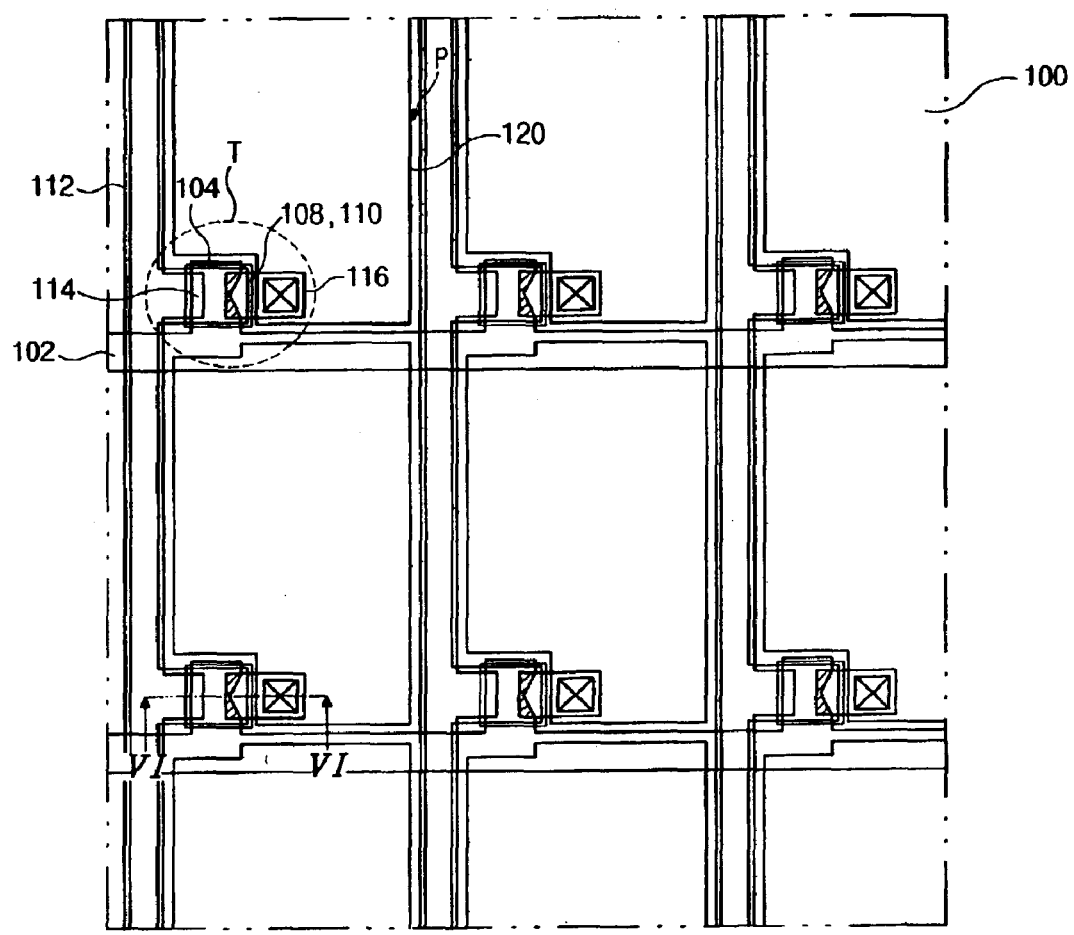
FIG. 4 is a schematic plane view showing an exemplary array substrate for a liquid crystal display device according to an embodiment of the present invention.
Figure 5:
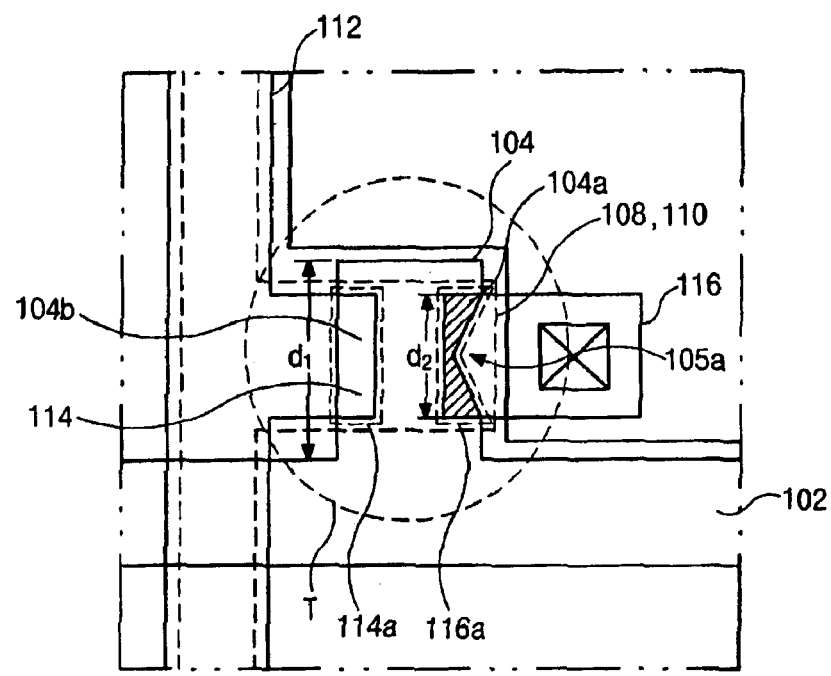
FIG. 5 is a schematic plane view showing an exemplary thin film transistor of an array substrate for a liquid crystal display device according to an embodiment of the present invention.

FIG. 4 is a schematic plane view showing an exemplary array substrate for a liquid crystal display device according to an embodiment of the present invention. FIG. 5 is a schematic plane view showing an exemplary thin film transistor of an array substrate for a liquid crystal display device according to an embodiment of the present invention.

In FIGS. 4 and 5, an array substrate 100 may include a gate line 102 and a data line 112 crossing each other to define a pixel region "P." A thin film transistor (TFT) "T" may be disposed at a crossing of the gate line 102 and the data line 112. The TFT "T" may include a gate electrode 104, an active layer 108, an ohmic contact layer 110, and source and drain electrodes 114 and 116. The gate electrode 104 may protrude from the gate line 102, and a scan signal may be supplied to the gate electrode 104 through the gate line 102. The source and drain electrodes 114 and 116 may be spaced apart from each other, and the active layer 108 may include a channel region at a space between the source and drain electrodes 114 and 116. The source electrode 114 may protrude from the data line 112, and an image signal may be supplied to the source electrode 114 through the data line 112. The ohmic contact layer 110 may be interposed between the source and drain electrodes 114 and 116 and the active layer 108. A pixel electrode 120 contacting the drain electrode 116 may be disposed at the pixel region "P."

In FIG. 5, the gate electrode 104 includes first and second sides 104a and 104b. The first side 104a of the gate electrode 104 may overlap the drain electrode 116 to define a first overlapping portion 116a, the second side 104b of the gate electrode 104 may overlap the source electrode 114 to define a second overlapping portion 114a. The gate electrode 104 may have a first sunken portion 105a at the first side 104a in the first overlapping portion 104a. For example, the first sunken portion 105a may have a "V" shape (a laid "V" shape). When the gate electrode 104 has a first length "$d_1$" along a direction of the data line 112 and the first sunken portion 105a has a second length "$d_2$" along the direction of the data line 112, the second length "$d_2$" is shorter than the first length "$d_1$" and may be longer than about 4 μm. Although not shown, a second sunken portion may be formed at the second side 104b in the second overlapping portion 114a.

Since the gate electrode 104 may include the first sunken portion 105a, an overlapping area of the gate electrode 104 and the drain electrode 116 may be reduced. Accordingly, a kickback voltage may be reduced so that the disadvantages of flickering and image sticking may be prevented.

Figure 6:
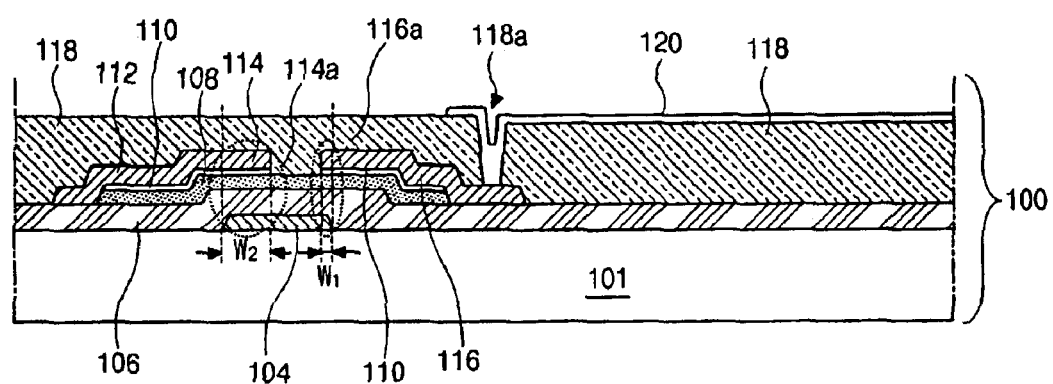
FIG. 6 is a schematic cross-sectional view taken along VI—VI of FIG. 4 according to the present invention.

FIG. 6 is a schematic cross-sectional view taken along a line VI—VI of FIG. 4 according to the present invention. In FIG. 6, a gate electrode 104 and a gate line 102 (of FIG. 5) connected to the gate electrode 104 are formed on a substrate. The gate electrode 104 and the gate line 102 (of FIG. 5) may be made of an opaque conductive material. The gate electrode 104 may include a first sunken portion 105a (of FIG. 5) at a first side 104a (of FIG. 5). In another embodiment, the gate electrode 104 may include a second sunken portion at a second side. For example, the first sunken portion 105a (of FIG. 5) may have a "V" shape (a laid "V" shape). When the gate electrode 104 has a first length "$d_1$" (of FIG. 5) along a direction of the data line 112, and the first sunken portion 105a (of FIG. 5) has a second length "$d_2$" (of FIG. 5) along the direction of the data line 112, the second length "$d_2$" (of FIG. 5) is shorter than the first length "$d_1$" (of FIG. 5) and may be longer than about 4 μm.

A gate insulating layer 106 including one of silicon nitride ($SiN_x$) and silicon oxide ($SiO_2$) may be formed on the gate electrode 104 and the gate line 102 (of FIG. 5). An active layer 108 and an ohmic contact layer 110 may be formed on the gate insulating layer 106 by sequentially by depositing and patterning amorphous silicon (a–Si:H) and impurity-doped amorphous silicon (n+a–Si:H). The active layer 108 and the ohmic contact layer 110 may be patterned to be disposed under a data line 112 and source and drain electrodes 114 and 116 that will be formed in a subsequent fabricating step. The adhesion property of the data line 112 and the source and drain electrodes 114 and 116 may be improved by the active layer 108 and the ohmic contact layer 110. The data line 112 and the source and drain electrodes 114 and 116 may be formed on the ohmic contact layer 110 by depositing and patterning a conductive metallic material. The source electrode 114 may extend from the data line 112, and may be spaced apart from the drain electrode 116.

After the data line 112 and the source and drain electrodes 114 and 116 are formed, an exposed portion of the ohmic contact layer 110 between the source and drain electrodes 114 and 116 may be sequentially etched to expose the active layer 108. A passivation layer 118 made of one of an organic insulating material group including benzocyclobutene (BCB) and acrylic resin may be formed on the data line 112 and the source and drain electrodes 114 and 116. A drain contact hole 118a exposing the drain electrode 116 may be formed through etching the passivation layer 118. A pixel electrode 120 may be formed on the passivation layer 118, and may be connected to the drain electrode 116 through the drain contract hole 118a.

In FIG. 6, since the gate electrode 104 includes the first sunken portion 105a (of FIG. 5), a first width "$w_1$" of a first overlapping portion 116a of the gate electrode 104 and the drain electrode 116 may be shorter than a second width "$w_2$" of a second overlapping portion 114a of the gate electrode 104 and the source electrode 114. Accordingly, a plane area of the first overlapping portion 116a may be smaller than a plane area that of the second overlapping portion 114a. Since a parasitic capacitance is proportional to an area of a parasitic capacitor, a gate-drain parasitic capacitance between the gate electrode 104 and the drain electrode 116 is smaller than a gate-source parasitic capacitance between the gate electrode 104 and the source electrode 114. Therefore, the gate-drain parasitic capacitance is reduced. When the gate electrode 104 includes the second sunken portion, the gate-source parasitic capacitance may also be reduced. Accordingly, a kickback voltage is reduced due to reduction of the gate-drain parasitic capacitance so that the disadvantages of flickering and image sticking may be prevented. Therefore, an LCD device having high display quality and large display size can be obtained.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a substrate;
    a gate line on the substrate;
    a data line crossing the gate line to define a pixel region;
    a thin film transistor connected to the gate line and the data line, and includes a gate electrode having opposing first and second edges and only the first edge including an indented portion, an active layer, an ohmic contact layer, and a source and a drain electrodes; wherein
        the drain electrode overlapping the indented portion, and
        the source electrode overlapping the second edge of the gate electrode,
        the indented portion of the first edge has a substantially "V" shape such that
        the vertex of the substantially "V" shaped indented portion corresponds to a center of the overlapping drain electrode; and
    a pixel electrode connected to the thin film transistor, and disposed in, the pixel.

2. The substrate according to claim 1, wherein the gate electrode protrudes from the gate line to define a first length of the gate electrode along a direction of the data line, and the source electrode protrudes from the data line.

3. The substrate according to claim 2, wherein the active layer and the ohmic contact layer extend under the data line.

4. The substrate according to claim 3, wherein the active layer includes amorphous silicon and the ohmic contact layer includes impurity-doped amorphous silicon.

5. The substrate according to claim 1, wherein the indented portion has a second length along the direction of the data line that is shorter than the first length and longer than about 4 μm.

6. A fabricating method of an array substrate for a liquid crystal display device, comprising:

forming a gate line and a gate electrode on a substrate, the gate electrode having opposing first and second edges and only the first edge includes a indented portion;

forming a gate insulating layer on the gate line and the gate electrode;

forming an active layer on the gate insulating layer;

forming an ohmic contact layer on the active layer;

forming a data line and a source and a drain electrodes on the ohmic contact layer, the data line crossing the gate line to define a pixel region, the drain electrode overlapping the gate electrode at the first edge and the source electrode overlapping the gate electrode at the second side edge, wherein the indented portion has a substantially "V" shape such that the vertex of the substantially "V" shaped indented portion corresponds to a center of the overlapping drain electrode;

forming a passivation layer on the data line and the source and drain electrodes, the passivation layer having a drain contact hole exposing the drain electrode; and forming a pixel electrode at the pixel region, and connected to the drain electrode through the drain contact hole.

7. The method according to claim 6, wherein the gate electrode protrudes from the gate line, along the first side edge to define a first length, and the source electrode protrudes from the data line.

8. The method according to claim 7, wherein the active layer and the ohmic contact layer extend under the data line.

9. The method according to claim 8, wherein the active layer includes amorphous silicon and the ohmic contact layer includes impurity-doped amorphous silicon.

10. The method according to claim 6, wherein the indented portion has a second length along a direction of the data line that is shorter than the first length and longer than about 4 μm.

11. A thin film transistor, comprising:

a substrate;

a gate electrode on the substrate having opposing first and second edges and only the first side edge including a indented portion;

an active layer over the gate electrode; and source and drain electrodes over the active layer, the drain electrode overlapping the gate electrode at the first side edge and the source electrode overlapping the gate electrode at the second edge, wherein the indented portion has a substantially "V" shape such the vertex of the substantially "V" shaped indented portion corresponds to a center of the overlapping drain electrode.

12. The transistor according to claim 11, wherein the indented portion has a substantially "V" shape.

13. The transistor according to claim 12, wherein the first side has a first length and the indented portion has a second length shorter than the first length and longer than about 4 μm.

* * * * *